Figure 1:
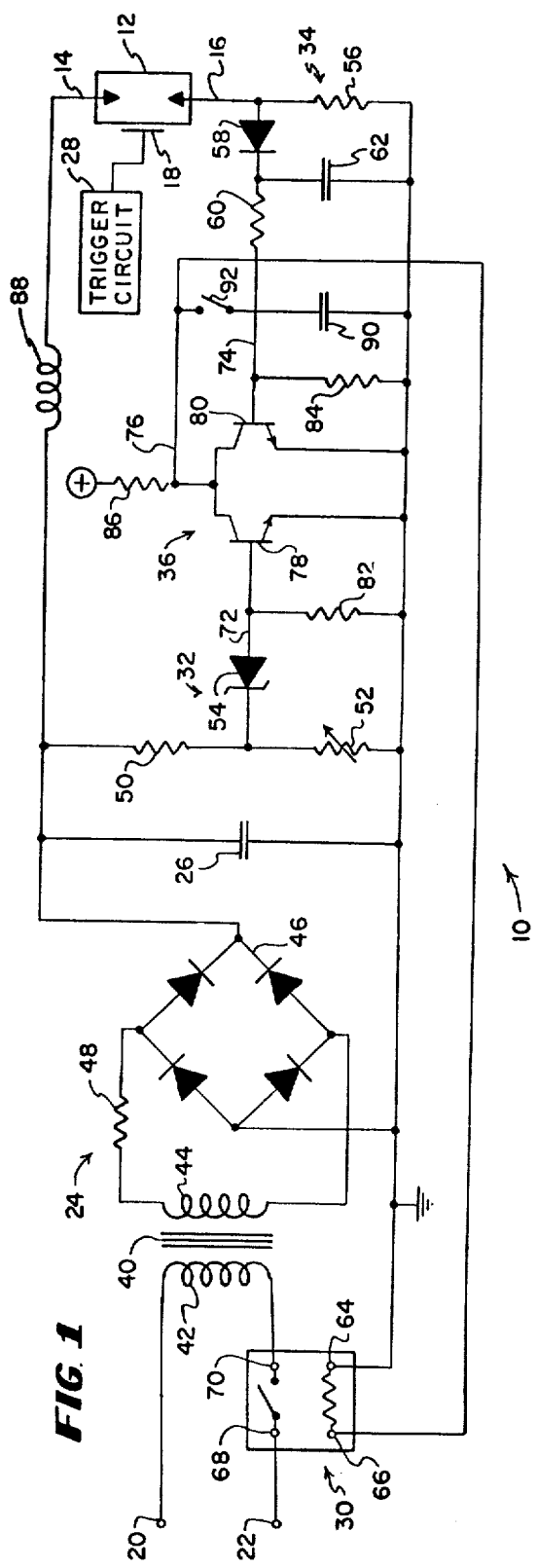

United States Patent [19]

Wrzesinski

[11] 3,962,601
[45] June 8, 1976

[54] ZERO CROSSING RELAY CONTROLLED CIRCUIT FOR HIGH POWER DISCHARGE DEVICES

[76] Inventor: Stanley Wrzesinski, 1535 N. Bosworth, Chicago, Ill. 60622

[22] Filed: Feb. 18, 1975

[21] Appl. No.: 550,415

[52] U.S. Cl. .................. 315/241 R; 315/241 P; 315/243
[51] Int. Cl.² .......................... H05B 41/32
[58] Field of Search ......... 315/241 R, 241 P, 241 S, 315/242, 243

[56] References Cited
UNITED STATES PATENTS

| | | | |
|---|---|---|---|
| 3,162,786 | 12/1964 | Capteyn | 315/241 P X |
| 3,316,445 | 4/1967 | Ahrons | 315/241 P X |
| 3,375,403 | 3/1968 | Flieder | 315/241 P X |
| 3,644,818 | 2/1972 | Paget | 315/241 S X |

*Primary Examiner*—Siegfried H. Grimm
*Attorney, Agent, or Firm*—Wolfe, Hubbard, Leydig, Voit & Osann Ltd.

[57] ABSTRACT

A circuit for operating a high power ionizable discharge device such as a xenon flash tube or other gas filled lamp includes a trigger circuit for gating the device periodically to produce a discharge condition. A capacitive energy storage circuit discharges through the device when the device is placed in a discharge condition. A low resistance power supply circuit charges the energy storage circuit. First and second sensing circuits respectively detect the charge level of the energy storage circuit and detect discharge of the discharge device. A switching device comprising a zero crossing solid state relay controls the energization of the power supply circuit. A control circuit is operated by the first sensing circuit to operate the switching device so that the power supply circuit is deenergized when the energy storage circuit is charged to a predetermined level. The second sensing circuit operates the control circuit to maintain the power supply disabled during discharge for a time sufficient for deionization of the discharge device.

5 Claims, 2 Drawing Figures

ZERO CROSSING RELAY CONTROLLED CIRCUIT FOR HIGH POWER DISCHARGE DEVICES

The present invention relates to improvements in operating circuits for ionizable discharge devices.

Ionizable discharge devices such as xenon or other gas filled lamps are useful in high intensity applications such as, for example, obstruction lighting systems for aircraft warnings, laser pumping, and the like. Typically a device of this type is operated by charging a capacitive energy storage circuit to a predetermined level and then discharging the capacitive circuit through the discharge device. A commonly used type of discharge device includes a pair of main electrodes connected to the capacitive energy storage circuit and a grid or control electrode connected to a trigger circuit. The trigger circuit is operated to apply a high voltage to the grid or control electrode, whereupon the lamp is placed in an ionized condition with the result that its internal resistance abruptly decreases permitting the energy storage circuit rapidly to discharge and dissipate energy in the discharge device.

A typical operating circuit of the type widely used in the past includes a power supply incorporating substantial resistance for charging the capacitive discharge circuit. Substantial resistance limits the charging rate so that upon discharge of the device, the device is permitted to become deionized thus enabling recharging of the capacitve energy storage circuit. As a result of the low charging rate, the frequency of individual discharges is limited to a relatively low level. Moreover, this type of circuit is subject to the disadvantages of large size, expense, high power consumption, and heat dissipation because of the use of substantial resistance in the power supply.

While it would be desirable to increase the charging rate by providing a power supply incorporating only minimal resistance, difficulties are encountered with this approach. The principal difficulty is that a power supply of this character charges the capacitive energy storage circuit at a rate high enough to maintain the discharge device in an ionized condition so that the desired discrete discharges are not produced. Attempts to overcome this problem in the past have involved approaches such as transformer switching in the high voltage circuit as disclosed in U.S. Pat. No. 3,707,649, impedance mismatching in the charging circuit as disclosed in U.S. Pat. No. 3,551,738 and manual switching as disclosed in U.S. Pat. No. 3,154,732. These approaches to the problem have not been fully satisfactory for reasons including complexity, expense, and unreliability.

An important object of the present invention is to provide improvements in operating circuits for discharge devices such as xenon lamps and to overcome the disadvantages of known circuits. Other important objects are to provide an operating circuit having high power driving capabilities; to provide a circuit wherein high operating frequencies are obtainable; to provide a circuit characterized by energy efficiency; to provide a circuit capable of maintaining control over the charging circuit in both self-triggering and external triggering situations; to provide a circuit wherein power flow into the discharge device is regulated in a reliable and novel fashion; and to provide an operating circuit for an ionizable discharge device characterized by simplicity, low cost, and reliability and convenience in operation.

In brief, in accordance with the above and other objects of the present invention, there is provided a circuit for operating a discharge device such as a xenon or other gas filled lamp or the like including a capacitive energy storage circuit coupled to the discharge device for discharging through the device. A trigger means is coupled to the discharge device for selectively producing an ionized condition of the device and permitting discharge therethrough. A low resistance power supply connected between a power source and the capacitive energy storage circuit functions to charge the energy storage circuit.

In accordance with the invention, a switching device connected to the inlet of the power supply controls the energization of the power supply. A charge level sensing means serves to operate the switching device to deenergize the power supply when the capacitive energy storage circuit is charged to a predetermined level, this level being adjustable to regulate the power flow into the discharge device. A discharge sensing means in circuit with the discharge device detects the occurrence of a discharge condition, and controls the switching device to maintain deenergization of the power supply during the discharge and following the discharge for a period of time sufficient to assure deionization of the discharge device.

Figure 2:
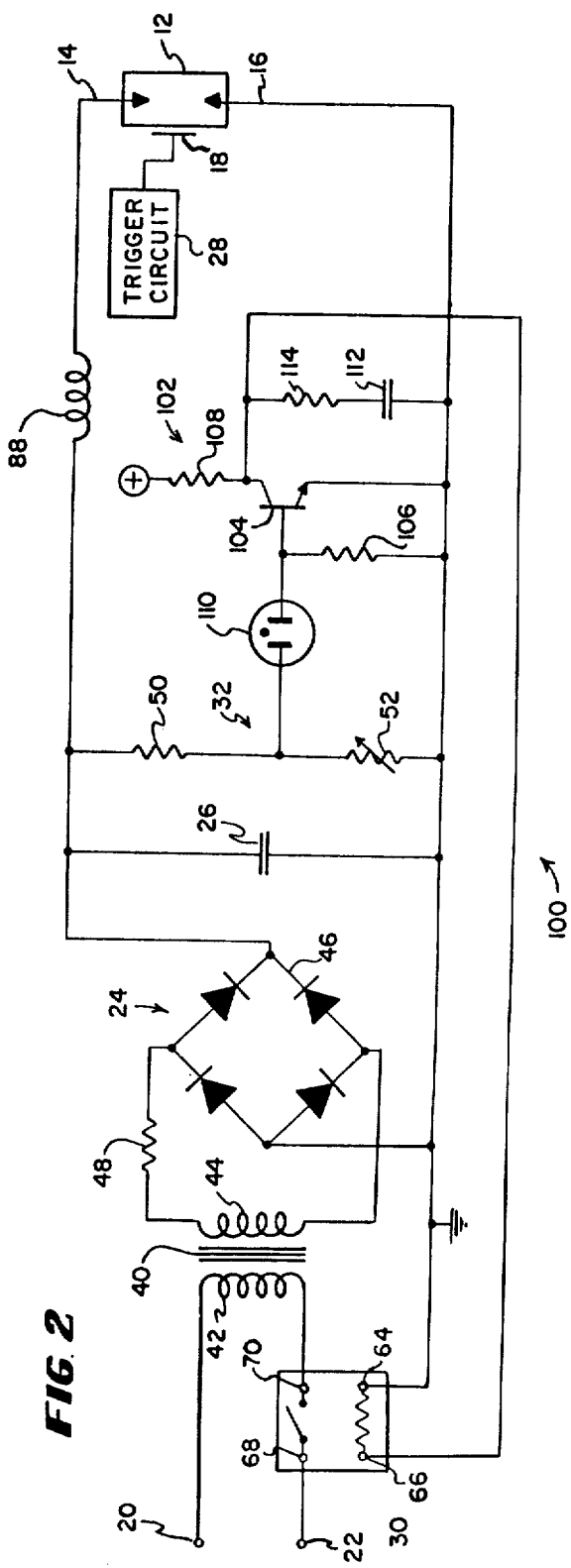

The invention together with the above and other objects and advantages thereof will be best understood from consideration of the embodiments of the invention illustrated in the accompanying drawing wherein:

FIG. 1 is a schematic and diagrammatic illustration of an operating circuit for a discharge device in accordance with the present invention; and FIG. 2 is a schematic and diagrammatic illustration of an operating circuit comprising an alternative embodiment of the invention.

Having reference now to FIG. 1 there is illustrated an operating circuit designated as a whole by the reference numeral 10 for controlling the operation of a discharge device 12. In the illustrated arrangement, device 12 comprises a xenon lamp, or flash tube, having a pair of main electrodes 14 and 16 together with a control electrode or grid 18. It should be understood that principles of the present invention are applicable to ionizable discharge devices of many types.

In general, the operating circuit 10 includes a pair of input terminals 20 and 22 adapted to be interconnected with a power source such as a standard nominal 240 volt 60 cycle AC power source. A power supply generally designated as 24 is coupled between the input terminals 20 and 22 and a capacitive energy storage circuit, illustrated as a capacitor 26, for charging the capacitor 26. A trigger circuit 28 is connected to electrode 18 of the device 12 selectively to place the device in a discharge or ionized condition whereupon capacitor 26 discharges through the device 12.

In accordance with a feature of the present invention, there is provided a switching device generally designated as 30 connected in circuit with the input terminals 20 and 22 and the power supply 24 for controlling the energization of the power supply. A charge level sensing circuit generally designated as 32 and a discharge sensing circuit generally designated as 34 function through the agency of a control circuit generally designated as 36 for controlling the switching device 30. More specifically, the charge level sensing circuit 32 and control circuit 36 function to enable charging of the capacitor 26 to a predetermined charge level, at which time the power supply 24 is deenergized. The discharge sensing circuit 34 and circuit 36 function to maintain deenergization of the power supply 24 during discharge of the device 12 and following discharge for a period of time sufficient to permit deionization of the device 12 making possible recharge of the capacitor 26.

Proceeding now to a more detailed description of the operating circuit 10, the power supply 24 is characterized by minimum resistance and fast operation. Power supply 24 is capable of charging capacitor 26 to an operating voltage, for example in the neighborhood of three thousand volts, in a short time, for example a small fraction of a second. The power supply includes a step-up transformer 40 having a primary winding 42 adapted to be connected to the input terminals 20 and 22 and having a secondary winding 44 connected to the input terminals of a full wave diode bridge rectifier circuit 46. The ratio of turns of winding 44 to winding 42 may, for example, be in the neighborhood of ten to one. Circuit 24 is illustrated as including a resistor 48, but it should be understood that this resistance is of a very small value sufficient only to protect the diodes of the bridge 46. Indeed, the internal resistance of the power supply may be sufficient for this purpose and the use of a discrete resistor may not be required.

The size of the capacitive energy storage circuit may be selected in accordance with the power requirements of the device 12. In the illustrated arrangement, the capacitor 26 is approximately 150 microfarads.

In accordance with the invention, the sensing circuits 32 and 34, the control circuit 36 and the switching device 30 are provided selectively to control the energization and deenergization of the power supply 24. The charge level sensing circuit 32 includes a resistive voltage divider including a resistor 50 in series with a resistor 52. The common terminal of resistors 50 and 52 is coupled to the control circuit 36 by means of a voltage responsive switching device 54 taking the form of a zener diode. When the voltage across capacitor 26 reaches a predetermined desired value, diode 54 assumes its conductive condition to apply a signal to the control circuit 36 thereby to operate the switching device 30 from a conductive to a nonconductive condition. In this manner, charging of the capacitor 26 is discontinued when the desired charge level is reached.

The charge level sensing circuit 32 functions as an intensity control, and for this reason resistor 52 is a variable resistor. Resistor 52 can be adjusted to a value for producing switching of the diode 54 at a selected charge level of the capacitor 26 and in this manner the energy dissipated in the discharge device 12 may be regulated.

Discharge sensing circuit 34 includes a resistance in series with the output terminals 14 and 16 of the discharge device 12. When the discharge device 12 is triggered by the application of a signal from the trigger circuit 28 to the grid electrode 18, capacitor 26 discharges in a current surge through the device 12. As a result, a voltage appears across the resistor 56, and this voltage is applied as a control signal to the control circuit 36 through a diode 58 and a network including a resistor 60 and capacitor 62.

In order to avoid damage to the power supply 24 and specifically to the diodes of the bridge 46 due to switching transients, the switching device 30 preferably takes the form of a zero crossing solid state relay. This device includes a pair of control terminals 64 and 66 and a pair of output terminals 68 and 70. When a control signal in the form of a predetermined voltage is applied to control terminals 64 and 66, the device is switched between a normally open condition of terminals 68 and 70 and an operated or closed circuit condition wherein terminals 68 and 70 are interconnected. Since the device 30 operates only when the controlled wave form crosses or is closely adjacent the zero axis, the power supply 24 is not subjected to switching at substantial voltages. Any commercially available solid state relay having sufficient current rating may be used, one example being the model D-2440 solid state relay manufactured and sold by Crydom Controls Division of International Rectifier Corporation.

Control circuit 36 controls the operation of the swiching device 30 in accordance with signals received from the sensing circuits 32 and 34. Functionally the circuit 36 comprises a NOR gate having a pair of inputs 72 and 74 and a single output 76. When both inputs 72 and 74 are at a low or reference ground potential, the output 76 is at a relatively high or positive potential. Since output 76 is connected to control terminal 66 of the device 30, in this condition the device 30 is operated to interconnect output terminals 68 and 70 of the device 30. When either one or both of the inputs 72 and 74 of the circuit 36 are at a relatively positive potential due to operation of either of the sensing circuits 32 or 34, the output 76 drops to a relatively low or reference ground potential thereby discontinuing the operation of the device 30 and opening the circuit between the output terminals 68 and 70.

In the illustrated arrangement the control circuit 36 includes a pair of transistors 78 and 80 connected in parallel with one another in a common emitter configuration. Each transistor is provided with a base resistor 82 and 84, and the collector electrodes of the transistors 78 and 80 are connected to one another and are connected by means of a resistor 86 to a source of relatively positive operating potential.

Transistors 78 and 80 are selected to be operated to saturation by a relatively small base current, for examaple in the neighborhood of 0.2 milliamperes. Consequently, the resistors 50 and 52 may desirably have a very large value so that after charging of the capacitor 26, only negligible leakage current flows through the series connected resistors 50 and 52. In the illustrated arrangement, resistor 50 may have a value in the neighborhood of 1.5 megohms, resistor 52 being selected to be variable between values corresponding to the range of desired charge levels of the capacitor 26. Similarly, resistor 56 may be selected to have an extremely small value thus to provide only minimal impedance in series with the device 12. In the illustrated arrangement for example the value of resistor 56 may be in the neighborhood of 0.05 ohm.

In the operation of the circuit 10 of the present invention, when the terminals 20 and 22 are initially interconnected with a power source, the capacitor 26 is in an uncharged condition. As a result, the base electrode of transistor 78 comprising input 72 of the circuit 26 is at a low or reference ground potential, and transistor 78 is in its nonconductive condition. Since no voltage exists across resistor 56 in the absence of a discharge, the base electrode of transistor 80 comprising the input 74 of circuit 36 is also at a low or reference ground potential and transistor 80 is also in a nonconductive condition. The collector electrodes of transistors 78 and 80 comprising the output 76 of the circuit 36 are at a relatively high potential, and the switching device 30 is operated by current flowing from the relatively positive potential source through resistor 86 and through the control terminals 66 and 64 of the device 30.

As a result of operation of switching device 30, its output terminals 68 and 70 are interconnected and current flows through the primary winding 42 of the transformer 40. The stepped up voltage appearing on the secondary winding 44 is rectified by the bridge 46 and quickly charges capacitor 26. It should be noted that since the power supply 24 includes only minimal resistance, capacitor 26 is charged very quickly, and the problems of large size, slow operation, energy dissipation, and heat loss experienced with high resistance power supplies are avoided.

When the charge level of capacitor 26 reaches a predetermined value as selected by adjustment of variable resistor 52, zener diode 54 is operated from its nonconductive to its conductive condition. As a result, base current flows to transistor 78 driving it to a saturated conductive condition. As a result, the collector of transistor 78 drops to a low or substantially reference ground potential thus discontinuing the operation of the switching device 30 and terminating the charging of the capacitor 26 at the selected predetermined charge level.

Once the capacitor 26 has been charged, the circuit 10 remains in a quiescent condition until operation of the trigger circuit 28. When the circuit 28 triggers the device 12 by application of an ionizing voltage to the grid electrode 18, the resistance of the device 12 drops abruptly from a high value to a low value. Capacitor 26 discharges in a surge through a circuit including the main terminals 14 and 16. In accordance with conventional practice, an inductance 88 may be connected in series with the device 12 to provide a desired discharge wave shape.

During the discharge pulse, the charge level of capacitor 26 drops below the level required to maintain zener diode 54 in a conductive condition and as a result the base current supplied to transistor 78 is discontinued. However, the discharge sensing circuit 34 comes into operation at this time to maintain the power supply 24 deenergized. More specifically, as current flows through the discharge device 12, capacitor 62 is charged to a voltage corresponding to that appearing across resistor 56. Base current is applied to the base electrode of transistor 80 through resistor 60, and transistor 80 is operated to a saturated conductive condition. Thus the collector electrode of transistor 80 corresponding to the output 76 of control circuit 36 is maintained at a relataively low, substantially reference ground potential. Terminals 68 and 70 of switching device 30 are maintained in an open circuit condition and the power supply 24 is maintained in a deenergized condition.

After dissipation in the device 12 of the energy stored in capacitor 26, the device 12 returns to a high resistance, deionized condition. The time required for complete deionization of the device 12 varies in accordance with many factors including the physical characteristics of the device 12 and the amount of power dissipated during discharge of the capacitor 26. The capacitor 62 and resistor 60 form a time delay circuit and the transistor 80 is maintained conductive for a period of time following discharge of the device 12 in order to assure complete deionization.

In the event that a great time interval is required for stable and reliable operation, an additional time delay may be provided. In the illustrated arrangement, this additional time delay is achieved through the provision of a capacitor 90 adapted to be interconnected between the collector electrode of transistor 80 and reference ground potential through the closing of a switch 92. When included in the circuit, capacitor 90 cooperates with resistor 86 to provide an additional time delay circuit maintaining the swiching device 30 in the open circuit condition. The sizes of the capacitors 62 and 90 as well as of the resistors 60 and 86 are selected to provide the time delay desired for stable operation of any particular device 12 at the desired energy levels.

When the potential of output 76 of circuit 36 increases after discharge of the capacitor 26 through the device 12, the switching device 30 is once again operated to its closed circuit condition and capacitor 26 recharges to its predetermined level as described above. The operation described heretofore is repeated each time that trigger circuit 28 operates to ionize device 12.

One important aspect of the operating circuit 10 comes into play in the case of self-ionization of the device 12. Under some conditions it may be possible for the device 12 to become ionized without the application of a trigger signal from the circuit 28. However, the discharge sensing circuit 34 operates regardless of whether the discharge is induced by triggering or is self-induced so that the power supply 24 is deenergized. Thus even in the case of self-triggering the device 12 is prevented from being placed in a continuously ionized condition. Similarly, it should be understood that the deionization circuit including discharge sensing circuit 34, circuit 36 and switching device 30 may be used in connection with discharge devices which are intended to be self-ionizing rather than being externally operated by a trigger circuit.

The operating circuit 10 permits very high power driving capability, useful for example in some laser applications. Since the capacitor 26 can be recharged very quickly after discharge, it is possible to operate the circit 10 at a high frequency. For one example, it is possible to operate the trigger circuit 28 at a frequency of 60 hertz. When this is done, the device 12 discharges in a rapid sequence of operations and, where a visible lamp is used, the frequency is high enough so that the discrete flashes are visually resolved into a continuous elongated flash by the eye of the observer.

Having reference now to FIG. 2 there is illustrated an alternative embodiment of the present invention comprising an operating circuit 100. In some respects the components of the circuit 100 are similar to components of the circuit 10 described above, and in these cases identical reference numerals are used and the components are not again described in detail.

In accordance with the present invention, the circuit 100 is provided with a control circuit generally designated as 102 for deenergizing the power supply 24 when the capacitor 26 is charged to its predetermined level, and for thereafter maintaining the power supply 24 deenergized for a period of time sufficient to permit deionization of the device 12. It should be noted that in the circuit 100 this is accomplished without provision of a discharge sensing circuit such as the circuit 34 described above.

More specifically, the circuit 102 includes a transistor 104 connected in common emitter configuration and provided with a base resistor 106. Prior to operation of the circuit 100, the transistor 104 is in a nonconductive condition, and a relatively positive signal is applied to the input of switching device 30 by a resistor 108 connected between the collector electrode of transistor 104 and a source of relatively positive potential. The base electrode of transistor 104 is coupled to the common terminal of resistors 50 and 52 by means of a discharge device 110 in the form of a neon lamp. This device has the characteristic that it switches from a normally nonconductive to a conductive condition at a first relatively high voltage and switches from its conductive condition back to its nonconductive condition at a second substantially lower voltage.

In operation, when the capacitor 26 reaches a predetermined charge level as established by adjustment of the variable resistor 52, the lamp 110 is switched from its nonconductive to its conductive condition. Base current is applied to the transistor 104 and the transistor is operated in its saturated conductive condition. The collector electrode of transistor 104 consequently drops to a relatively low, substantially reference ground potential operating the switching device 30 to deenergize the power supply 24. Consequently, charging of capacitor 26 is discontinued at this time.

When device 12 is ionized by operation of the trigger circuit 28, the capacitor 26 discharges through the device 12. Although the voltage across the capacitor 26 and thus the voltage across the resistors 50 and 52 drops during the discharge, the device 110 does not immediately resume its nonconductive condition. Rather the device 110 remains conductive until a voltage substantially lower than the predetermined selected charge voltage of capacitor 26 is reached. During this period of time, base current is continued to be applied to transistor 104 and the switching device 30 is maintained in its nonconductive condition.

As the voltage across capacitor 26 reaches a relatively low level, device 110 returns to its nonconductive condition and transistor 104 is once again rendered nonconductive. However, switching device 30 is maintained in its open circuit condition due to the provision of a time delay circuit including a capacitor 112 and a resistor 114 connected between the collector of transistor 104 and reference ground potential. The time delay characteristic of this circuit is selected to defer operation of the switching device 30 until after device 12 has become deionized. At the end of the time delay period, device 30 is operated to the closed circuit condition and capacitor 26 recharges.

While the invention has been described with reference to details of the illustrated embodiments, such details are not intended to limit the scope of the invention as defined in the following claims.

What is claimed and desired to be secured by Letters Patent of the United States is:

1. A circuit for operating high power discharge devices comprising in combination:
    trigger means coupled to said discharge device for producing a discharge condition in said discharge device;
    an energy storage circuit including capacitive reactance coupled to said discharge device for discharging through said discharge device when said discharge device is in a discharge condition;
    charging means coupled between a power source and said energy storage circuit for charging said energy storage circuit;
    switching means comprising a zero crossing solid state relay coupled to said charging means for selectively disabling and enabling said charging means;
    first sensing means for sensing the level of charging of said energy storage circuit;
    second sensing means for sensing the occurrence of discharge in said discharge device; and
    control means coupled between said first and second sensing means and said switching means for disabling said charging circuit in response to the existence of a predetermined charge level of said energy storage circuit and in response to the occurrence of discharge in said discharge device.

2. The circuit of claim 1, said first sensing means comprising a voltage divider connected across said capacitive reactance, and a voltage responsive switching device connected to said voltage divider.

3. A circuit for operating a high power ionizable discharge device comprising in combination:
    capacitive energy storage means connected in circuit with the discharge device;
    trigger means for selectively producing an ionized condition of the discharge device for discharge of said capacitive energy storage means through the discharge device;
    sensing means connected to said capacitive energy storage means for sensing the level of charge of said capacitive energy storage means;
    charging means connected to said capacitive energy storage means for charging said capacitive energy storage means;
    control means coupled between said sensing means and said charging means for disabling said charging means when the charge level reaches a predetermined value and for enabling said charging means upon discharge of said charging means;
    said control means including means for maintaining said charging means in said disabled condition following discharge of said capacitive energy storage means for a period of time sufficient to permit deionization of said discharge device
    said charging means comprising a power supply having an output connected to said capacitive energy storage means and an input, said control means including switching means comprising a zero crossing solid state relay adapted to be connected to a power source and connected to said power supply input for controlling the energization thereof.

4. The circuit of claim 3, said maintaining means comprising second sensing means for sensing discharge of said discharge device, said second sensing means being coupled to said control circuit means for opening said switching means during discharge of said discharge device.

5. The circuit of claim 4, said maintaining means further comprising time delay means coupled to said control circuit means for delaying closing of said switching means after discharge of said discharge device.

* * * * *